(12) United States Patent
Kadoshima et al.

(10) Patent No.: US 10,062,773 B2
(45) Date of Patent: Aug. 28, 2018

(54) SEMICONDUCTOR DEVICE HAVING A TRANSISTOR AND FIRST AND SECOND EMBEDDED LAYERS

(71) Applicant: Renesas Electronics Corporation, Kawasaki-shi, Kanagawa (JP)

(72) Inventors: Masaru Kadoshima, Kanagawa (JP); Masao Inoue, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 63 days.

(21) Appl. No.: 14/712,894

(22) Filed: May 14, 2015

(65) Prior Publication Data
US 2015/0340479 A1 Nov. 26, 2015

(30) Foreign Application Priority Data

May 26, 2014 (JP) ................................ 2014-107950

(51) Int. Cl.
*H01L 29/739* (2006.01)
*H01L 29/10* (2006.01)
(Continued)

(52) U.S. Cl.
CPC .. *H01L 29/7397* (2013.01); *H01L 21/823892* (2013.01); *H01L 27/0922* (2013.01); *H01L 29/1095* (2013.01)

(58) Field of Classification Search
CPC ........... H01L 29/1095; H01L 27/10832; H01L 27/0922
See application file for complete search history.

(56) References Cited

U.S. PATENT DOCUMENTS 6,664,608 B1   12/2003 Burr
2002/0030237 A1*   3/2002 Omura ................ H01L 29/0634
                                                                257/397
(Continued)

FOREIGN PATENT DOCUMENTS

EP     1335425 A1   8/2003
EP     2341538 A2   7/2011
(Continued)

OTHER PUBLICATIONS

Extended European Search Report, dated Oct. 1, 2015, in European Application No. 15165397.9.
(Continued)

*Primary Examiner* — Thao X Le
*Assistant Examiner* — Geoffrey Ida
(74) *Attorney, Agent, or Firm* — Shapiro, Gabor and Rosenberger, PLLC

(57) ABSTRACT

The present invention makes it possible, in a manufacturing process of a semiconductor device, to inhibit: impurities from diffusing from a substrate to a semiconductor layer; and the withstand voltage of a transistor from deteriorating. In the present invention, a first electrically conductive type epitaxial layer is formed over a first electrically conductive type base substrate. The impurity concentration of the epitaxial layer is lower than that of the base substrate. A second electrically conductive type first embedded layer and a second electrically conductive type second embedded layer are formed in the epitaxial layer. The second embedded layer is deeper than the first embedded layer, is kept away from the first embedded layer, and has an impurity concentration lower than the first embedded layer. A transistor is further formed in the epitaxial layer.

18 Claims, 10 Drawing Sheets

(51) Int. Cl.
*H01L 21/8238* (2006.01)
*H01L 27/092* (2006.01)

(56) References Cited

U.S. PATENT DOCUMENTS

| | | | | |
|---|---|---|---|---|
| 2004/0012068 A1* | 1/2004 | Iwata | ................... | H01L 21/761 |
| | | | | 257/506 |
| 2004/0032005 A1* | 2/2004 | Williams | ............ | H01L 21/8224 |
| | | | | 257/510 |
| 2005/0045936 A1* | 3/2005 | Chang | ............... | H01L 27/10832 |
| | | | | 257/301 |
| 2006/0220140 A1 | 10/2006 | Robb et al. | | |
| 2007/0166925 A1* | 7/2007 | Takeda | ............ | H01L 21/823487 |
| | | | | 438/270 |
| 2007/0194375 A1* | 8/2007 | Kawaguchi | ......... | H01L 29/0634 |
| | | | | 257/330 |
| 2009/0114969 A1* | 5/2009 | Suzuki | ................ | H01L 29/0619 |
| | | | | 257/301 |
| 2009/0166730 A1* | 7/2009 | Okuno | ................ | H01L 29/0623 |
| | | | | 257/330 |
| 2009/0230468 A1 | 9/2009 | Cai | | |
| 2010/0052052 A1 | 3/2010 | Lotfi et al. | | |
| 2014/0097517 A1* | 4/2014 | Moens | .................... | H01L 29/36 |
| | | | | 257/607 |
| 2014/0175459 A1* | 6/2014 | Yamamoto | .......... | H01L 29/1095 |
| | | | | 257/77 |

FOREIGN PATENT DOCUMENTS

| | | |
|---|---|---|
| JP | 58-087866 A | 5/1983 |
| JP | 62-040719 A | 2/1987 |
| JP | 2002-176177 A | 6/2002 |
| JP | 2010-232673 A | 10/2010 |

OTHER PUBLICATIONS

Office Action, dated Jun. 20, 2018, in European Application No. 15165397.9.

* cited by examiner

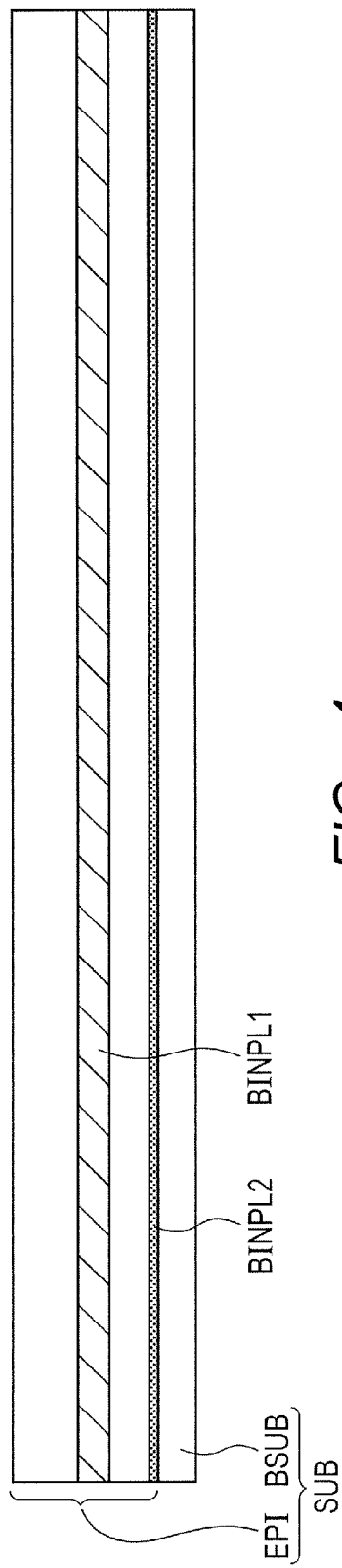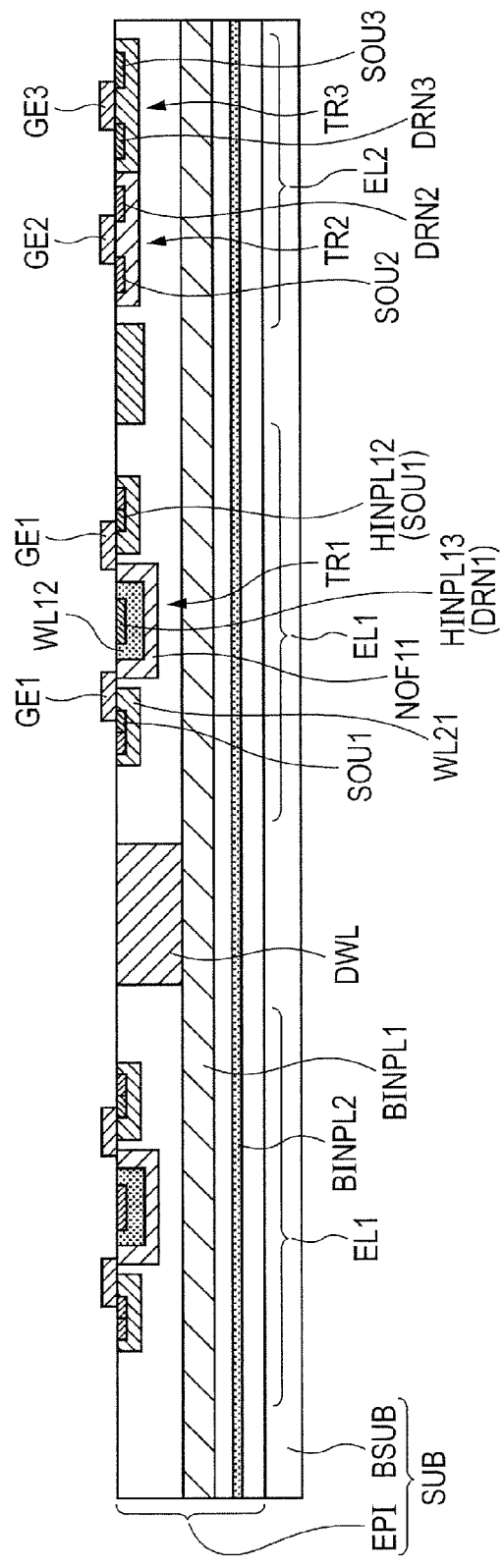

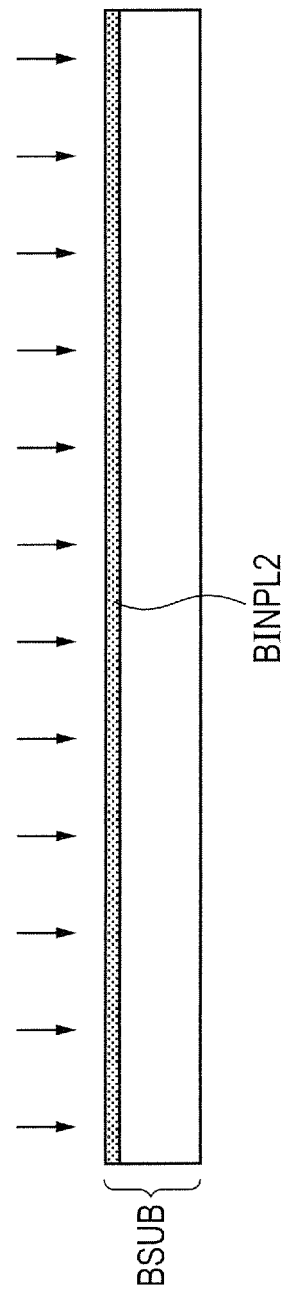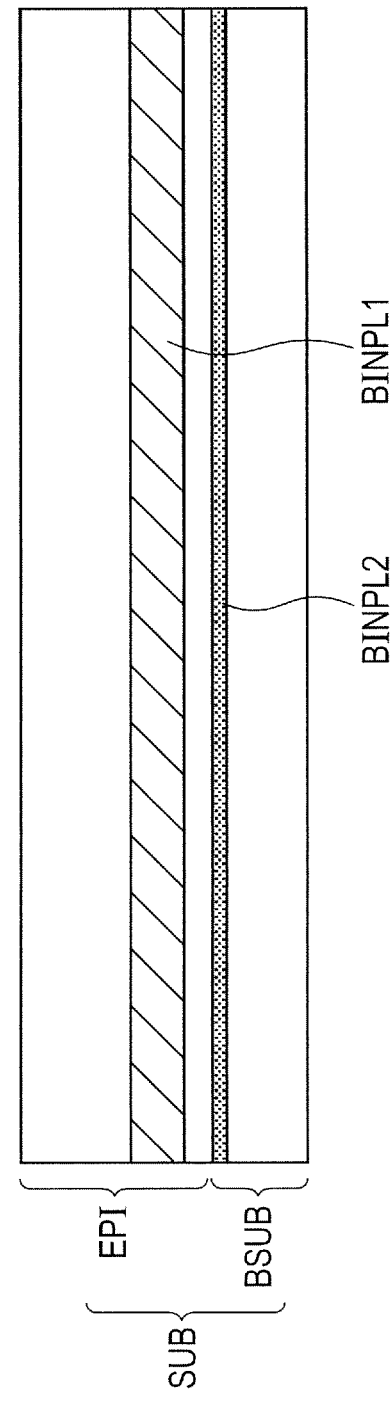

SEMICONDUCTOR DEVICE HAVING A TRANSISTOR AND FIRST AND SECOND EMBEDDED LAYERS

CROSS-REFERENCE TO RELATED APPLICATIONS

The disclosure of Japanese Patent Application No. 2014-107950 filed on May 26, 2014 including the specification, drawings and abstract is incorporated herein by reference in its entirety.

BACKGROUND

The present invention relates to a semiconductor device and is, for example, a technology applicable to a semiconductor device having a diffusion layer embedded into a substrate.

In a semiconductor device, it sometimes happens that a diffusion layer is embedded into a substrate and a transistor is formed over the diffusion layer. In the transistor, a substance formed by epitaxially growing a semiconductor layer over a semiconductor substrate acting as a base is used as the substrate for example. Then the diffusion layer is: formed by an ion implantation method after the semiconductor layer is formed in some cases; or formed when the semiconductor layer is epitaxially grown in other cases.

Meanwhile, Japanese Unexamined Patent Application Publication No. Sho 62 (1987)-40719 describes that p-type impurities are diffused over the surface of a p-type substrate acting as a base by a thermal diffusion method and successively an epitaxial layer is grown over the substrate.

Further, Japanese Unexamined Patent Application Publication No. 2002-176177 describes that a semiconductor substrate is formed by forming an n-type epitaxial layer over the surface of a p-type substrate acting as a base and a trench gate type IGBT is formed by using the semiconductor substrate. In Japanese Unexamined Patent Application Publication No. 2002-176177, the epitaxial layer has a configuration formed by stacking a low-concentration n-type layer over a high-concentration n-type layer.

SUMMARY

When a semiconductor layer is formed over a substrate acting as a base, a diffusion layer is embedded into the semiconductor layer, and a transistor is formed over the diffusion layer, the withstand voltage of the transistor is dominated by the distance between the substrate acting as the base and the diffusion layer in some cases. Since impurities are also introduced into the substrate however, there has been the possibility that the impurities diffuse from the substrate to the semiconductor layer in the manufacturing process of a semiconductor device and the withstand voltage of the transistor deteriorates. Other problems and novel features will be obvious from the descriptions and attached drawings in the present specification.

According to an embodiment, a first electrically conductive type semiconductor layer is formed over a first electrically conductive type base substrate. The impurity concentration of the semiconductor layer is lower than that of the base substrate. A second electrically conductive type first embedded layer and a second electrically conductive type second embedded layer are formed in the semiconductor layer. The second embedded layer is deeper than the first embedded layer, is kept away from the first embedded layer, and has an impurity concentration lower than the first embedded layer. A transistor is further formed in the semiconductor layer.

According to the embodiment, it is possible to inhibit: impurities from diffusing from the substrate to the semiconductor layer; and the withstand voltage of the transistor from deteriorating.

BRIEF DESCRIPTION OF THE DRAWINGS

FIG. 3 is a sectional view showing a manufacturing method of a semiconductor device.

FIG. 4 is a sectional view showing the manufacturing method of the semiconductor device.

FIGS. 7A and 7B are sectional views showing a manufacturing method of a semiconductor device according to Second Embodiment.

DETAILED DESCRIPTION

Figure 1:
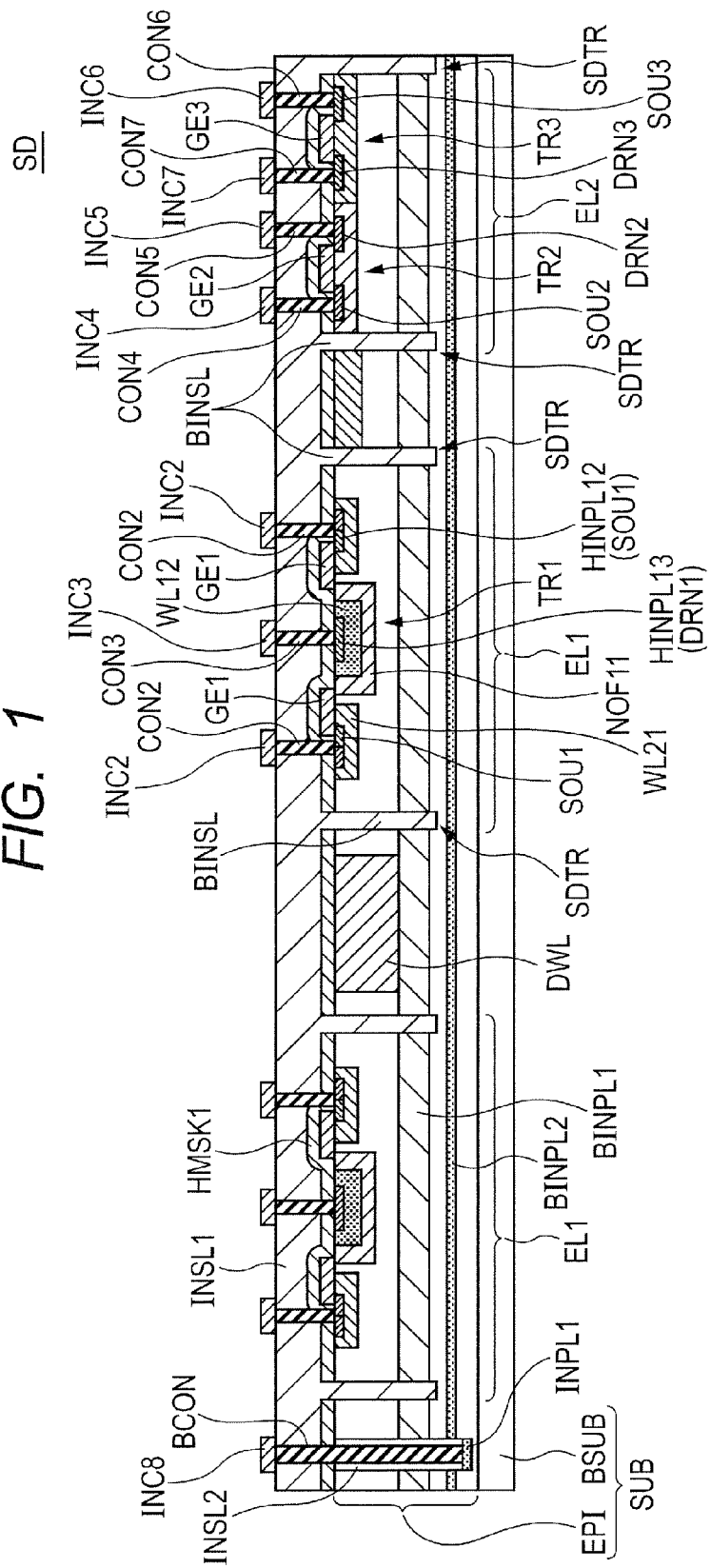
FIG. 1 is a sectional view showing the configuration of a semiconductor device according to First Embodiment.

Embodiments are explained in reference to the drawings hereunder. In all the drawings, similar constituent components are represented by similar reference numerals and explanations are omitted appropriately.

First Embodiment

FIG. 1 is a sectional view showing the configuration of a semiconductor device SD according to First Embodiment. The semiconductor device SD according to the present embodiment is formed by using a substrate SUB. The substrate SUB is formed by growing an epitaxial layer EPI (semiconductor layer) comprising a semiconductor (for example silicon) over a base substrate BSUB comprising a bulk semiconductor (for example monocrystal silicon). Both the base substrate BSUB and the epitaxial layer EPI are an identical electrically conductive type (first electrically conductive type: for example P-type). The impurity concentration of the base substrate BSUB is higher than that of the epitaxial layer EPI.

A first embedded layer BINPL1 that is an electrically conductive type (second electrically conductive type: for example n-type) different from the epitaxial layer EPI is formed in the epitaxial layer EPI. The first embedded layer BINPL1 is kept away from the base substrate BSUB. The first embedded layer BINPL1: either may be formed when the epitaxial layer EPI is grown epitaxially; or may be formed by an ion implantation method after the epitaxial layer EPI is formed. In the former case, the first embedded layer BINPL1 is formed over the whole surface of the substrate SUB.

Further, a second embedded layer BINPL2 is formed in the epitaxial layer EPI. The second embedded layer BINPL2 is a second electrically conductive type impurity layer, is deeper than the first embedded layer BINPL1, and is kept away from the first embedded layer BINPL1. The impurity concentration of the second embedded layer BINPL2 is lower than that of the first embedded layer BINPL1. The second embedded layer BINPL2 is formed in order to inhibit: the impurities of the base substrate BSUB from diffusing in the epitaxial layer EPI; and the first electrically conductive type impurity concentration in the lower layer of the epitaxial layer EPI from increasing.

Then transistors TR2 and TR3 constituting a logic circuit and a transistor TR1 for electric power control are formed in the epitaxial layer EPI. At least the transistor TR1 overlaps with the first embedded layer BINPL1 in a planar view.

The following explanations are based on the case where the first electrically conductive type is a p-type and the second electrically conductive type is an n-type. It is also possible however that the first electrically conductive type is an n-type and the second electrically conductive type is a p-type.

The transistor TR2 is an n-type low withstand voltage transistor and has a gate electrode GE2, a source SOU2, and a drain DRN2. The transistor TR3 is a p-type low withstand voltage transistor and has a gate electrode GE3, a source SOU3, and a drain DRN3. The transistors TR2 and TR3 include a CMOS transistor. Meanwhile, a gate insulating film (not shown in the figure) is formed under the gate electrodes GE2 and GE3.

The transistor TR1 is a horizontal transistor for electric power control and has a withstand voltage higher than the transistors TR2 and TR3. The transistor TR1 has a gate electrode GE1, a source SOU1, and a drain DRN1. The distance between the drain DRN1 and the gate electrode GE1 is larger than the distance between the source SOU1 and the gate electrode GE1. As a result, the withstand voltage between the drain DRN1 and the gate electrode GE1 is higher. A gate insulating film (not shown in the figure) is formed under the gate electrode GE1. The gate insulating film is thicker than the gate insulating film of the transistors TR2 and TR3. Here, an element isolation insulating film formed by an STI method or a LOCOS method is formed between the drain DRN1 and the gate electrode GE1.

The drain DRN1 has an n-type well WL12 and an n-type high concentration region HINPL13 formed over the surface layer of the n-type well WL12. The high concentration region HINPL13 is coupled to a contact CON3. Further, an n⁻-type offset region NOF11 is formed around the n-type well WL12. In other words, the n-type well WL12 is formed in the surface layer of the offset region NOF11.

Meanwhile, the source SOU1 has an n-type high concentration region HINPL12. The high concentration region HINPL12 is formed in the surface layer of a p-type well WL21. Although it is not shown in the figure, a p-type high concentration region is formed at a part of the p-type well WL21 located adjacent to the high concentration region HINPL12. Then a contact CON2 is coupled to the p-type high concentration region and the high concentration region HINPL12.

Then an insulating film HMSK1 and an interlayer insulating film INSL1 are formed over the substrate SUB. The insulating film HMSK1 is a silicon nitride film for example and the interlayer insulating film INSL1 is a silicon oxide film for example. Contacts CON2, CON3, CON4, CON5, CONE, and CON7 are embedded into the insulating film HMSK1 and the interlayer insulating film INSL1. The contact CON2 is coupled to the source SOU1 of the transistor TR1 and the contact CON3 is coupled to the drain DRN1 of the transistor TR1. The contact CON4 is coupled to the source SOU2 of the transistor TR2 and the contact CON5 is coupled to the drain DRN2 of the transistor TR2. The contact CON6 is coupled to the source SOU3 of the transistor TR3 and the contact CON7 is coupled to the drain DRN3 of the transistor TR3. Meanwhile, although they are not shown in the figure, a contact coupled to the gate electrode GE1, a contact coupled to the gate electrode GE2, a contact coupled to the gate electrode GE3, and a contact coupled to a deep well DWL (described later) are also embedded into the insulating film HMSK1 and the interlayer insulating film INSL1.

Wires INC2, INC3, INC4, INC5, INC6, and INC7 are formed over the interlayer insulating film INSL1. The wires INC2, INC3, INC4, INC5, INC6, and INC7 comprise a metal such as aluminum for example and are coupled to the contacts CON2, CON3, CON4, CON5, CON6, and CON7 respectively. Meanwhile, wires (not shown in the figure) coupled to the respective gate electrodes and a wire (not shown in the figure) coupled to the deep well DWL are also formed over the interlayer insulating film INSL1.

The transistor TR1 is formed in a first element region EL1 and the transistors TR2 and TR3 are formed in a second element region EL2. More specifically, the single transistor TR1 is formed in the first element region EL1. In contrast, the plural transistors TR2 and TR3 are formed in the second element region EL2. Meanwhile, in FIG. 1, only a pair of the transistors TR2 and TR3 are shown in the second element region EL2 for the simplification of the figure. Then the first element region EL1 and the second element region EL2 are surrounded by element isolation trenches SDTR respectively. The element isolation trenches SDTR pass through the first embedded layer BINPL1 but do not reach the base substrate BSUB. Further in the example shown in the figure, the bottom parts of the element isolation trenches SDTR do not reach even the second embedded layer BINPL2. In other words, the element isolation trenches SDTR are formed so as to be shallower than the second embedded layer BINPL2.

Then an embedded insulating film BINSL is embedded into the element isolation trenches SDTR. In the example shown in the figure, the embedded insulating film BINSL is a part of the interlayer insulating film INSL1 over the substrate SUB.

Meanwhile, the n-type deep well DWL and an embedded contact BCON are further formed in the substrate SUB. The bottom face of the deep well DWL reaches the first embedded layer BINPL1 and the deep well DWL gives a fixed potential to the first embedded layer BINPL1. The embedded contact BCON is a contact embedded into the substrate SUB and passes through the first embedded layer BINPL1 and the second embedded layer BINPL2. As a result, a fixed potential is given by the embedded contact BCON to the epitaxial layer EPI and the base substrate BSUB under the second embedded layer BINPL2.

In the example shown in the figure, a p-type impurity region INPL1 is formed in the region of the epitaxial layer EPI touching the bottom face of the embedded contact BCON. The impurity concentration of the impurity region INPL1 is higher than that of the epitaxial layer EPI. The contact resistance between the embedded contact BCON and the epitaxial layer EPI decreases by forming the impurity region INPL1.

A groove (or hole) into which the embedded contact BCON is embedded is formed through the same process as a contact hole into which the contact CON2 is embedded for example. The groove (or hole) may otherwise be formed through an independent process. An insulating film (thermally-oxidized film for example) INSL2 is formed over the inner face of the groove. As a result, the embedded contact BCON is insulated from the first embedded layer BINPL1 and the part of the epitaxial layer EPI located above the first embedded layer BINPL1. Further, the embedded contact BCON is formed through the same process as the contact CON2 and other contacts. As a result, the embedded contact BCON passes through the interlayer insulating film INSL1 and the insulating film HMSK1 and the top end is coupled to a wire INC8 over the interlayer insulating film INSL1.

Meanwhile, the potential of the first embedded layer BINPL1 may be either a floating potential or a fixed potential. In the latter case, an impurity region for raising the first embedded layer BINPL1 electrically to the surface layer of the epitaxial layer EPI is formed in the epitaxial layer EPI. The lower part of the impurity region is coupled to the first embedded layer BINPL1 and a contact is coupled to the upper part of the impurity region.

Figure 2:
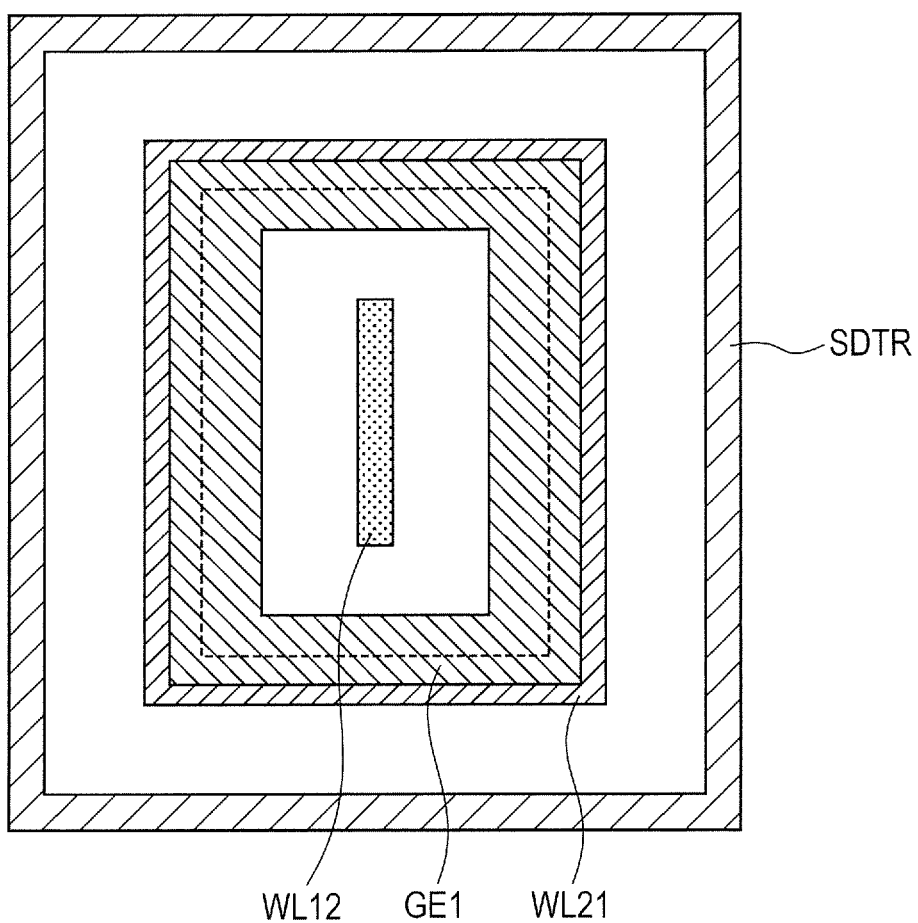
FIG. 2 is a plan view of a transistor.

FIG. 2 is a plan view of a transistor TR1. A gate electrode GE1 surrounds an n-type well WL12 of a drain DRN1 and a p-type well WL21 surrounds the gate electrode GE1. Then an element isolation trench SDTR is formed along the sides of a polygon (rectangle in the example shown in the figure) and surrounds the p-type well WL21. In other words, the transistor TR1 is located inside the element isolation trench SDTR.

Figure 5:
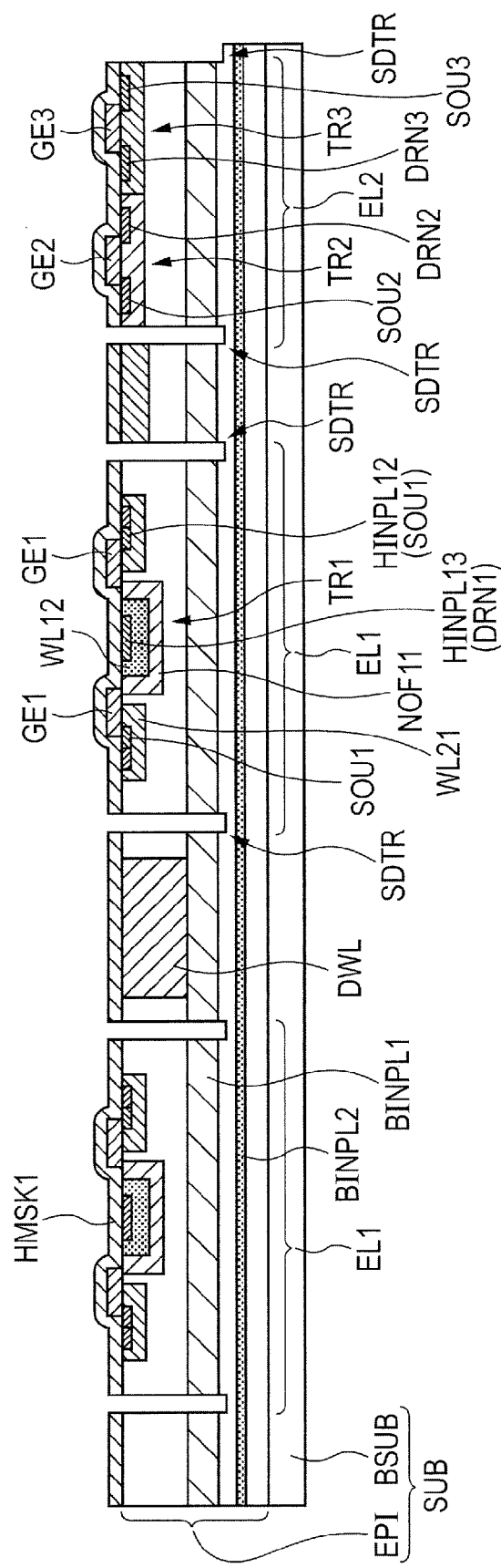
FIG. 5 is a sectional view showing the manufacturing method of the semiconductor device.

FIGS. 3 to 5 are sectional views showing a manufacturing method of a semiconductor device SD. The figures correspond to FIG. 1.

Firstly, as shown in FIG. 3, a base substrate BSUB is prepared. Successively, an epitaxial layer EPI is formed over the base substrate BSUB. On this occasion, a second embedded layer BINPL2 and a first embedded layer BINPL1 are formed by switching gases for introducing impurities in midstream. At the step, the second embedded layer BINPL2 is located immediately over the base substrate BSUB (in other words, at the lowermost layer of the epitaxial layer EPI) for example.

Successively, as shown in FIG. 4, various kinds of wells (including a deep well DWL) and an offset region NOF11 are formed in the epitaxial layer EPI by an ion implantation method for example. Successively, a groove is formed in the epitaxial layer EPI and an insulating film, a silicon oxide film for example, is embedded into the groove. As a result, an element isolation insulating film (not shown in the figure) is formed. Meanwhile, the various wells and the offset region NOF11 may otherwise be formed after the element isolation insulating film is formed.

Successively, a gate insulating film for transistors TR1, TR2, and TR3 is formed. Successively, a film (polysilicon film for example) as a material for gate electrodes is formed and the film is selectively removed. As a result, gate electrodes GE1, GE2, and GE3 are formed. Successively, high concentration regions (HINPL12 and HINPL13 for example) are formed in the epitaxial layer EPI by an ion implantation method for example.

Meanwhile, sidewalls may be formed over the side faces of the gate electrodes GE1, GE2, and GE3 in some cases. In such a case, the high concentration regions are formed after the sidewalls are formed.

Further, heat treatment is applied after the high concentration regions are formed in the epitaxial layer EPI. Impurities diffuse by the heat treatment and as a result the second embedded layer BINPL2 gets away from the base substrate BSUB.

Successively, as shown in FIG. 5, an insulating film HMSK1 is formed over the epitaxial layer EPI. Successively, a resist pattern (not shown in the figure) is formed over the insulating film HMSK1. The resist pattern has openings in the region where element isolation trenches SDTR are to be formed. Successively, the insulating film HMSK1 is etched with the resist pattern used as a mask. As a result, the openings are formed in the region of the insulating film HMSK1 where the element isolation trenches SDTR are to be formed.

Successively, the epitaxial layer EPI (also the element isolation insulating film in some locations) is etched with the insulating film HMSK1 used as a mask. As a result, the element isolation trenches SDTR are formed. When the resist pattern remains thereafter, the resist pattern is removed.

Successively, an interlayer insulating film INSL1 is formed. On this occasion, parts of the interlayer insulating film INSL1 are embedded into the element isolation trenches SDTR and come to be an embedded insulating film BINSL. On this occasion, voids may be formed in the element isolation trenches SDTR in some cases. Since the voids are occluded with the interlayer insulating film INSL1 (embedded insulating film BINSL) and are not exposed even at the succeeding processes however, the voids do not influence the quality of the semiconductor device SD.

Successively, a resist pattern (not shown in the figure) is formed over the interlayer insulating film INSL1 and the interlayer insulating film INSL1 is etched with the resist pattern used as a mask. As a result, contact holes for forming contacts are formed. In the process, a contact hole is also formed in the region of the interlayer insulating film INSL1 where an embedded contact BCON is to be formed. The contact hole reaches down to the bottom of a groove formed in the epitaxial layer EPI. Impurities are injected into the contact hole. As a result, an impurity region INPL1 is formed. Then a metal such as W is embedded into the contact holes. As a result, the contacts and the embedded contact BCON are formed.

Successively, a metal film (Al for example) is formed over the interlayer insulating film INSL1. Successively, the metal film is selectively removed. As a result, wires are formed.

Figure 6A:
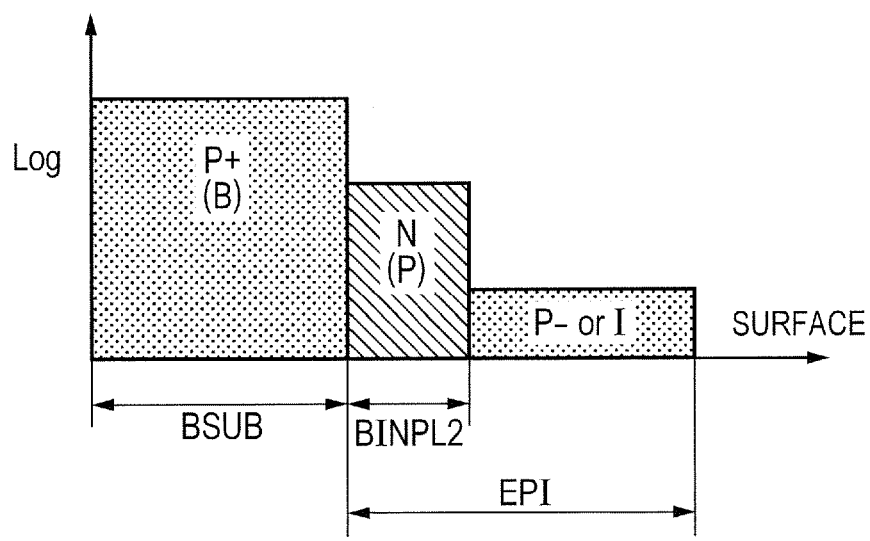
FIGS. 6A and 6B are views for explaining the distribution of impurities in the depth direction of a substrate.
Figure 6B:
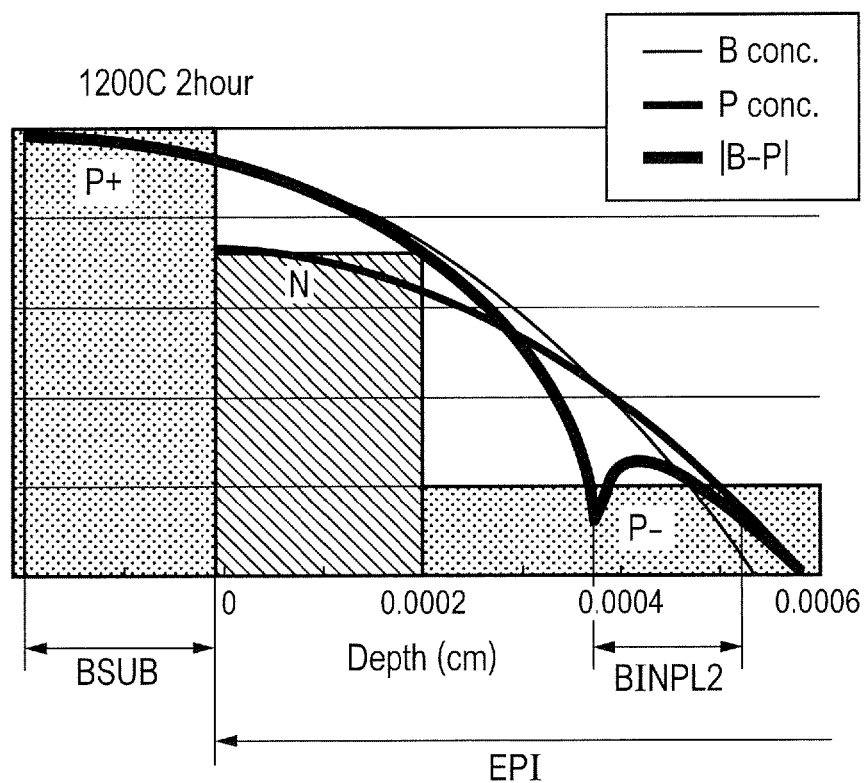

FIGS. 6A and 6B are views for explaining the distribution of impurities in the depth direction of a substrate SUB. FIG. 6A shows the distribution of impurities in a substrate SUB before the substrate SUB is subjected to heat treatment and FIG. 6B shows the result of simulating the distribution of the impurities in the substrate SUB after the substrate SUB is subjected to heat treatment.

As shown in FIG. 6A, a base substrate BSUB contains p-type impurities of a high concentration and an epitaxial layer EPI contains p-type impurities of a concentration lower than that of the base substrate BSUB. Then an n-type second embedded layer BINPL2 is formed in the region of the epitaxial layer EPI touching the base substrate BSUB. Here, the p-type impurities contained in the base substrate BSUB comprise B for example and the n-type impurities contained in the second embedded layer BINPL2 comprise P for example.

When the substrate SUB shown in FIG. 6A is subjected to heat treatment, the impurities contained in the respective layers diffuse thermally. In the state after heat treatment, the second embedded layer BINPL2 is defined as the region where an n-type impurity concentration is higher than a p-type impurity concentration. The second embedded layer BINPL2 according to the definition is located on the side closer to the surface of the epitaxial layer EPI than the second embedded layer BINPL2 in the state of FIG. 6A.

Meanwhile, when the second embedded layer BINPL2 is not formed in the state of FIG. 6A, the p-type impurities in the base substrate BSUB diffuse into the epitaxial layer EPI and hence the withstand voltage between the base substrate BSUB and a first embedded layer BINPL1 deteriorates.

In the present embodiment in contrast, since the second embedded layer BINPL2 is formed, the p-type impurities diffusing from the base substrate BSUB to the epitaxial layer EPI are offset by the n-type impurities contained in the second embedded layer BINPL2. As a result, the withstand voltage between the base substrate BSUB and a first embedded layer BINPL1 is inhibited from deteriorating. Here, when the epitaxial layer EPI is a silicon layer for example, the thermal diffusion rate of P is nearly identical to the thermal diffusion rate of B at about 1,000° C. Consequently, the offset effect is particularly large when B is elected as the p-type impurities contained in the base substrate BSUB and P is selected as the n-type impurities contained in the second embedded layer BINPL2.

Further, the second embedded layer BINPL2 is formed so as to be deeper than the element isolation trenches SDTR. As a result, it is possible to bring the second embedded layer BINPL2 closer to the base substrate BSUB. As a result, it is possible to effectively offset the impurities diffusing from the base substrate BSUB to the epitaxial layer EPI.

Second Embodiment

FIGS. 7A and 7B are sectional views showing a manufacturing method of a semiconductor device SD according to Second Embodiment. Firstly, as shown in FIG. 7A, a base substrate BSUB is prepared. Successively, n-type impurities are injected into the base substrate BSUB by thermal diffusion or ion implantation. As a result, a second embedded layer BINPL2 is formed in the surface layer of the base substrate BSUB.

Successively, an epitaxial layer EPI is formed over the base substrate BSUB. The method for forming the epitaxial layer EPI is the same as the method for forming an epitaxial layer EPI in First Embodiment except that the second embedded layer BINPL2 is not formed.

The succeeding processes are the same as First Embodiment.

Figure 8A:
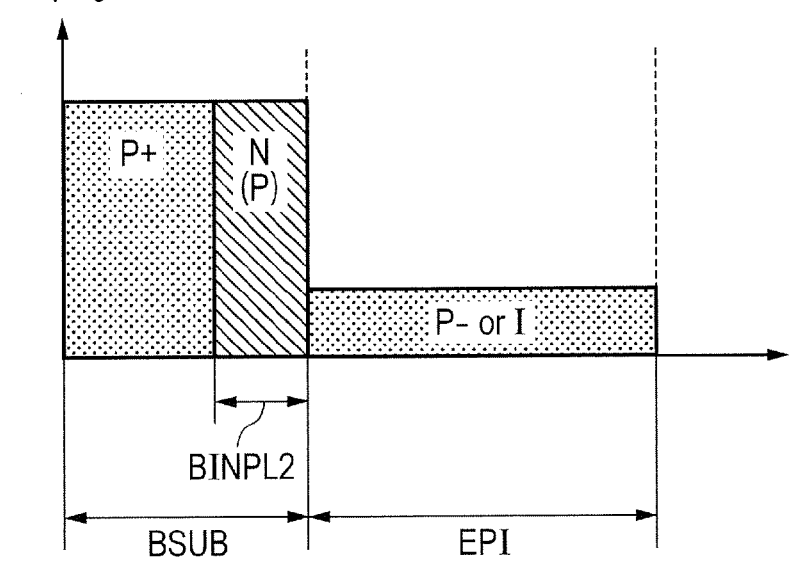
FIGS. 8A and 8B are views for explaining the distribution of impurities in the depth direction of a substrate.
Figure 8B:
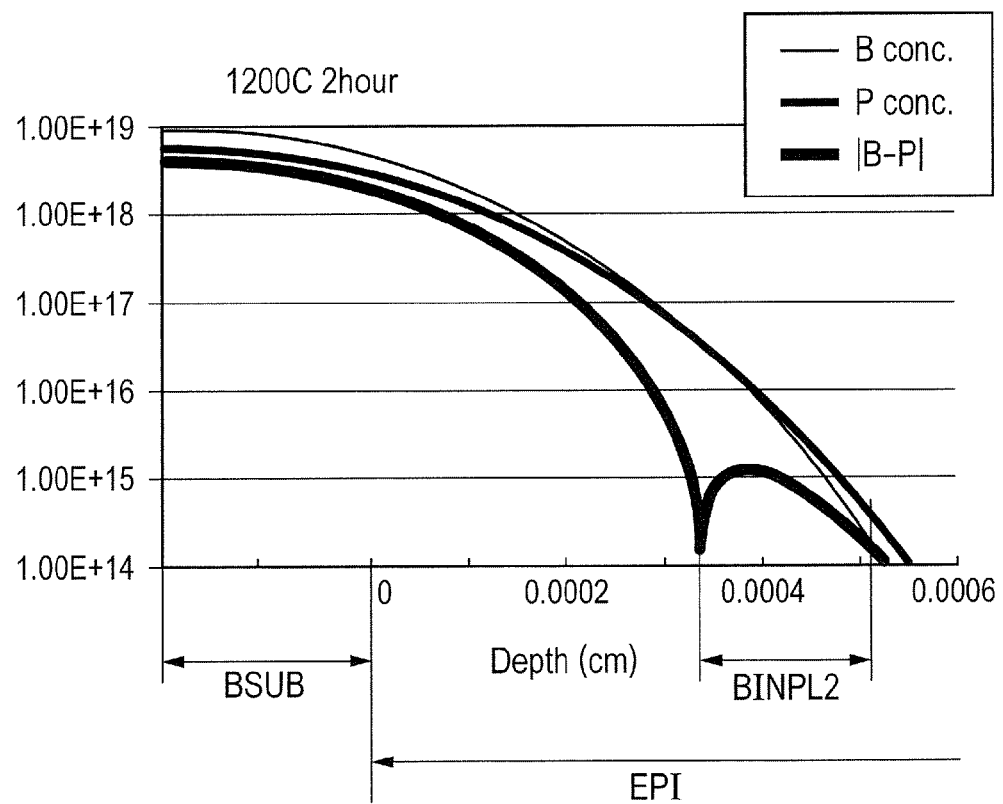

FIGS. 8A and 8B are views for explaining the distribution of impurities in the depth direction of a substrate SUB according to the present embodiment and correspond to FIGS. 6A and 6B in First Embodiment. FIG. 8A shows the distribution of impurities in a substrate SUB before the substrate SUB is subjected to heat treatment and FIG. 8B shows the result of simulating the distribution of the impurities in the substrate SUB after the substrate SUB is subjected to heat treatment.

As shown in FIG. 8A, in the state before heat treatment, a second embedded layer BINPL2 is formed in the surface layer of a base substrate BSUB. As shown in FIG. 8B in contrast, when a substrate SUB is subjected to heat treatment, the second embedded layer BINPL2 is defined as the region where the concentration of n-type impurities is higher than the concentration of p-type impurities in the same manner as First Embodiment. The second embedded layer BINPL2 according to the definition is located inside an epitaxial layer EPI in the example shown in the figure.

In the present embodiment too, the second embedded layer BINPL2 is formed in the substrate SUB and hence it is possible to inhibit the withstand voltage between the base substrate BSUB and a first embedded layer BINPL1 from deteriorating.

Third Embodiment

Figure 9:
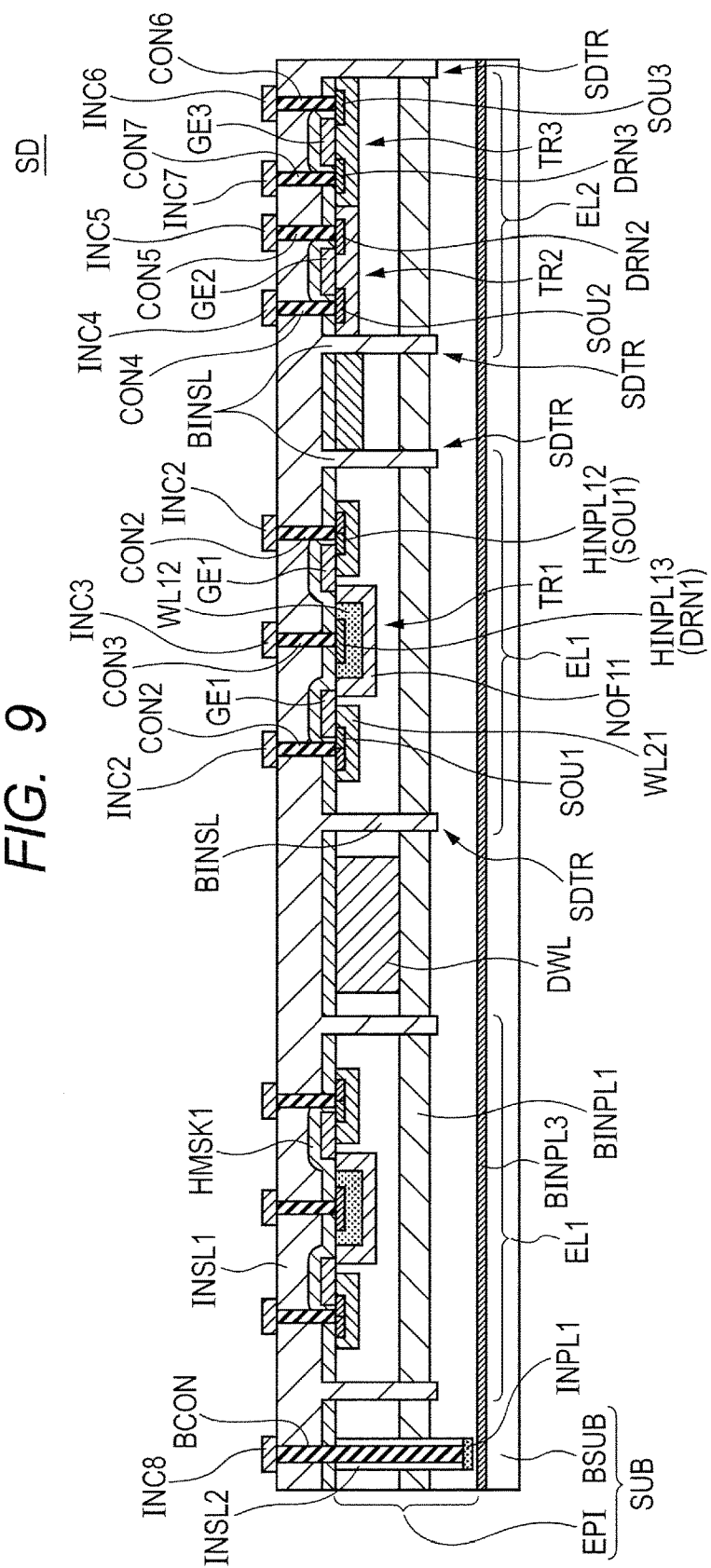
FIG. 9 is a sectional view showing the configuration of a semiconductor device according to Third Embodiment.

FIG. 9 is a sectional view showing the configuration of a semiconductor device SD according to Third Embodiment. The semiconductor device SD according to the present embodiment has a configuration similar to the semiconductor device SD according to Second Embodiment except that the semiconductor device SD according to the present embodiment has a third embedded layer BINPL3 instead of a second embedded layer BINPL2.

The third embedded layer BINPL3 is a layer into which an element (hereunder described as a diffusion inhibiting element) to inhibit impurities in a base substrate BSUB from thermally diffusing is introduced. The third embedded layer BINPL3 is formed by introducing a diffusion inhibiting element into the surface layer of the base substrate BSUB instead of n-type impurities in FIG. 7A of Second Embodiment. The diffusion inhibiting element is at least one of N, C, and O for example. The concentration of the diffusion inhibiting element in the third embedded layer BINPL3 is identical to or lower than the concentration of the p-type impurities in the base substrate BSUB and higher than the concentration of the p-type impurities in an epitaxial layer EPI, for example.

Figure 10A:
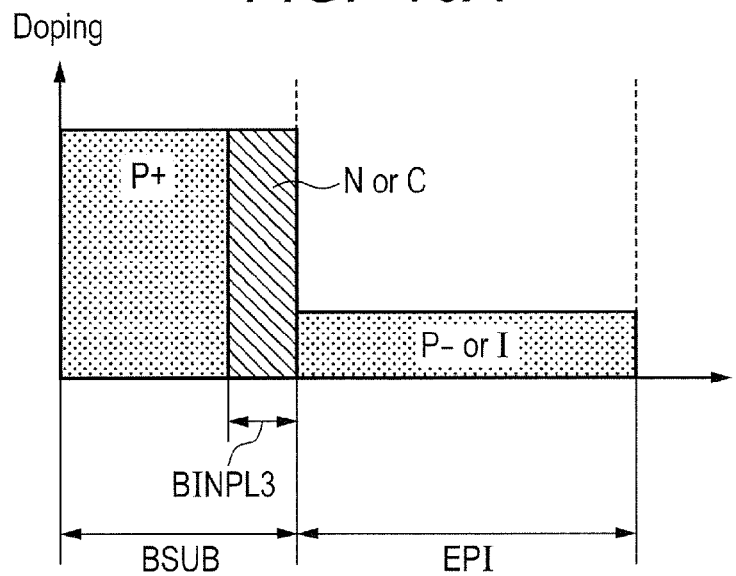
FIGS. 10A and 10B are views for explaining the distribution of impurities in the depth direction of a substrate.
Figure 10B:
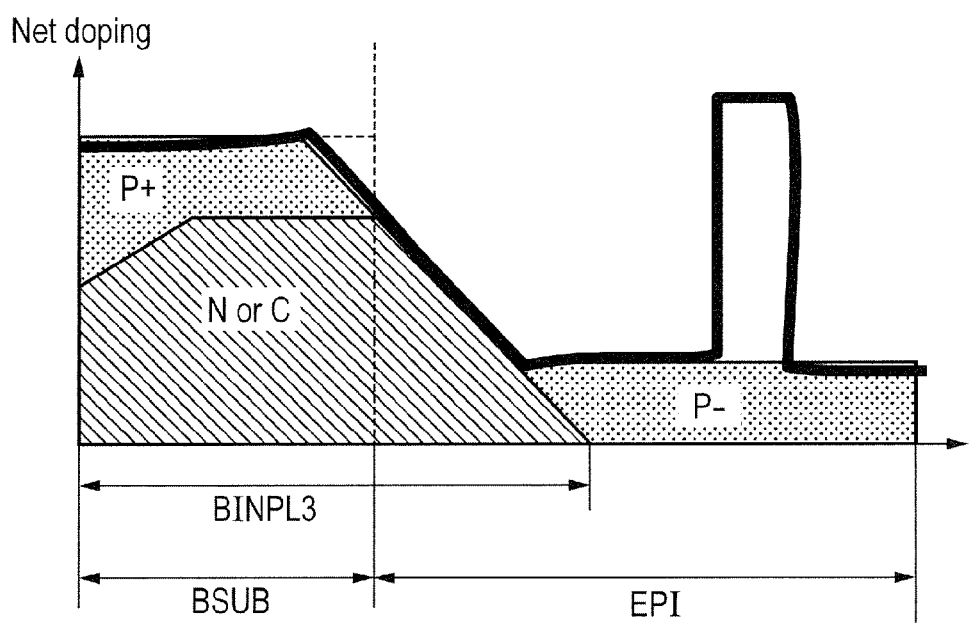

FIGS. 10A and 10B are views for explaining the distribution of impurities in the depth direction of a substrate SUB according to the present embodiment and correspond to FIGS. 8A and 8B in Second Embodiment. FIG. 10A shows the distribution of impurities in a substrate SUB before the substrate SUB is subjected to heat treatment and FIG. 10B shows the distribution of the impurities in the substrate SUB after the substrate SUB is subjected to heat treatment.

As shown in FIG. 10A, in the state before heat treatment, a third embedded layer BINPL3 is formed in the surface layer of a base substrate BSUB. As shown in FIG. 10B in contrast, when the substrate SUB is subjected to heat treatment, impurities in the base substrate BSUB diffuse toward an epitaxial layer EPI but the quantity of the diffusion is small because the third embedded layer BINPL3 is formed. Here, a diffusion inhibiting element in the third embedded layer BINPL3 also diffuses in the substrate SUB. As a result, the width of the third embedded layer BINPL3 increases.

In the present embodiment, the third embedded layer BINPL3 is formed in the substrate SUB and hence the impurities in the base substrate BSUB hardly diffuse toward the epitaxial layer EPI. As a result, it is possible to inhibit the withstand voltage between the base substrate BSUB and a first embedded layer BINPL1 from deteriorating.

Fourth Embodiment

Figure 11:
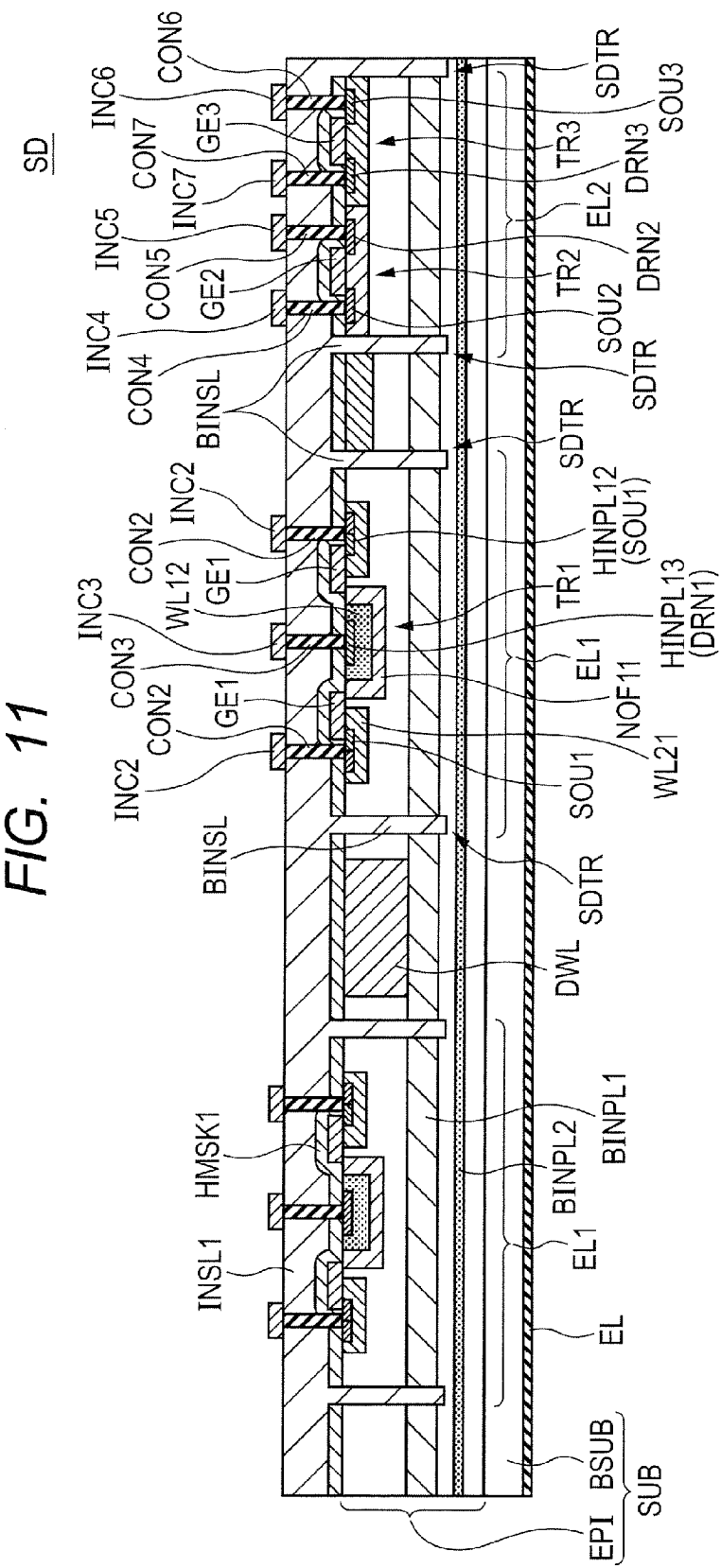
FIG. 11 is a sectional view showing the configuration of a semiconductor device according to Fourth Embodiment.

FIG. 11 is a sectional view showing the configuration of a semiconductor device SD according to Fourth Embodiment. The semiconductor device SD according to the present embodiment has a configuration similar to any one of First to Third Embodiments except that the semiconductor device SD according to the present embodiment has a backside electrode EL instead of an embedded contact BCON. The figure shows the case of a configuration similar to First Embodiment.

The backside electrode EL is formed over the surface of a base substrate BSUB where an epitaxial layer EPI is not formed and gives a fixed potential to the base substrate BSUB. The backside electrode EL comprises a metal such as Al for example. The backside electrode EL is formed by a sputtering method for example.

In the present embodiment too, it is possible to inhibit the withstand voltage between the base substrate BSUB and a first embedded layer BINPL1 from deteriorating.

Although the invention established by the present inventors has heretofore been explained concretely on the basis of the embodiments, it goes without saying that the present invention is not limited to the embodiments and can be modified variously within the scope not departing from the tenor of the invention.

What is claimed is:

1. A semiconductor device comprising:
a base substrate having a top surface and a bottom surface spaced from the top surface along a thickness direction, the base substrate having a first electrical conductivity type;
a semiconductor layer being formed over the top surface of the base substrate, having the first electrical conductivity type, and having an impurity concentration lower than that of the base substrate;
a first embedded layer formed in the semiconductor layer and having a second electrical conductivity type;
a second embedded layer being formed in the semiconductor layer, being spaced from the first embedded layer, having the second electrical conductivity type, and having an impurity concentration lower than that of the first embedded layer; and
transistors formed in the semiconductor layer, each transistor having a source region and a drain region formed in the semiconductor layer,
wherein the first embedded layer is between the second embedded layer and both the source and drain regions of at least one of the transistors along the thickness direction,
wherein the second embedded layer is between the first embedded layer and the base substrate along the thickness direction,
wherein the semiconductor device has:
trenches formed in the semiconductor layer and surrounding the transistors; and
an insulating film embedded in the trenches;
wherein bottom faces of the trenches are located between the first embedded layer and the second embedded layer along the thickness direction, and
wherein the trenches divide the first embedded layer into separate regions isolated from each other.

2. A semiconductor device comprising:
a base substrate having a top surface and a bottom surface spaced from the top surface along a thickness direction, the base substrate having a first electrical conductivity type;
a semiconductor layer being formed over the top surface of the base substrate, having the first electrical conductivity type, and having an impurity concentration lower than that of the base substrate;
a first embedded layer formed in the semiconductor layer and having a second electrical conductivity type;
a second embedded layer being formed in the semiconductor layer, being spaced from the first embedded layer, having the second electrical conductivity type, and having an impurity concentration lower than that of the first embedded layer; and
transistors formed in the semiconductor layer,
wherein the first embedded layer is between the second embedded layer and both a source region and a drain region of at least one of the transistors along the thickness direction,
wherein the second embedded layer is between the first embedded layer and the base substrate along the thickness direction,
wherein the semiconductor device has:
a hole formed in the semiconductor layer,
an insulating layer formed over the side face of the hole, and
a conductor embedded into the hole;
wherein the bottom face of the hole is between the second embedded layer and the bottom surface of the base substrate along the thickness direction;
wherein the conductor is electrically connected to at least the semiconductor layer,
wherein the source and the drain regions of the at least one of the transistors are both formed in the semiconductor layer at an upper surface of the semiconductor layer, and
wherein a gate electrode of the at least one of the transistors is formed over said upper surface of the semiconductor layer.

3. A semiconductor device according to claim 2,
wherein the semiconductor device has a region being formed in the semiconductor layer, being located at the bottom part of the hole, having the first electrical conductivity type, and having an impurity concentration higher than that of the semiconductor layer, and
wherein the conductor is electrically connected to the semiconductor layer via said region.

4. A semiconductor device according to claim 1, wherein the second embedded layer is doped with P, and the base substrate is doped with B.

5. A semiconductor device according to claim 1,
wherein the second embedded layer has impurities of both the first and second electrical conductivity types, and
wherein an impurity concentration of the second electrical conductivity type is greater than an impurity concentration of the first electrical conductivity type within the second embedded layer.

6. A semiconductor device according to claim 1,
wherein a deep well region having the second electrical conductivity type is disposed in the semiconductor layer between an adjacent pair of transistors in a plan view, the deep well region having a bottom surface in contact with a top surface of the first embedded layer such that the deep well region is electrically connected to the first embedded layer.

7. A semiconductor device comprising:
a base substrate having a first conductivity type;
an epitaxial layer formed over the base substrate and having the first conductivity type, an impurity concentration of the epitaxial layer being less than that of the base substrate;
a transistor having source and drain regions formed in a top portion of the epitaxial layer;
a first embedded layer formed within the epitaxial layer and having a second conductivity type different from the first conductivity type;
a second embedded layer formed within the epitaxial layer, having the second conductivity type, and having an impurity concentration less than that of the first embedded layer; and
at least one trench with an insulating film embedded therein and surrounding the transistor in a plan view, wherein each trench terminates within a second portion of the epitaxial layer and isolates a portion of the first embedded layer from other portions of the first embedded layer, and wherein, in a cross-sectional view, a first portion of the epitaxial layer, the second embedded layer, the second portion of the epitaxial layer, the first embedded layer, and the top portion of the epitaxial layer are disposed in order from bottom to top.

8. A semiconductor device according to claim 7, further comprising:

a hole extending from the top portion of the epitaxial layer to at least the first portion of the epitaxial layer;

an insulating film formed over sidewalls of the hole; and a conductor embedded within the hole and electrically connected at a bottom of the hole to the first portion of the epitaxial layer.

9. A semiconductor device according to claim 8, wherein a region is formed within the first portion of the epitaxial layer and has the first conductivity type, an impurity concentration of said region being higher than that of the epitaxial layer, and wherein the conductor is electrically connected to the first portion of the epitaxial layer via said region.

10. A semiconductor device according to claim 7, wherein one of the base substrate and the second embedded layer is doped with P, and the other of the base substrate and the second embedded layer is doped with B.

11. A semiconductor device according to claim 7, wherein the second embedded layer has impurities of both the first and second conductivity types, and wherein an impurity concentration of the second conductivity type is greater than an impurity concentration of the first conductivity type within the second embedded layer.

12. A semiconductor device according to claim 7, wherein a deep well region having the second conductivity type is disposed in the top portion of the epitaxial layer and is electrically connected to the first embedded layer.

13. A semiconductor device according to claim 1, wherein each transistor has a gate electrode formed over the semiconductor layer, and the first embedded layer is between a bottom surface of the gate electrode and an upper surface of the second embedded layer in the thickness direction.

14. A semiconductor device according to claim 7, wherein the transistor has a gate electrode formed over an upper surface of the top portion of the epitaxial layer, and the first embedded layer is between a bottom surface of the gate electrode and an upper surface of the second embedded layer.

15. A semiconductor device according to claim 1, wherein, along the thickness direction, a portion of the semiconductor layer is between and in contact with the first and second embedded layers, and the portion of the semiconductor layer has the first electrical conductivity type.

16. A semiconductor device according to claim 7, wherein the first, second, and top portions of the epitaxial layer have the first conductivity type.

17. A semiconductor device according to claim 2, wherein the gate electrode is arranged so as to form a channel region at the upper surface of the semiconductor layer between the source and drain regions of the at least one of the transistors.

18. A semiconductor device according to claim 1, wherein the second embedded layer overlaps with the first embedded layer in plan view.

* * * * *